United States Patent [19]

Miyazaki

[11] Patent Number: 5,420,053
[45] Date of Patent: May 30, 1995

[54] METHOD FOR MANUFACTURING SEMICONDUCTOR DEVICE HAVING BIPOLAR TRANSISTOR AND POLYCRYSTALLINE SILICON RESISTOR

[75] Inventor: Shinichi Miyazaki, Tokyo, Japan

[73] Assignee: NEC Corporation, Tokyo, Japan

[21] Appl. No.: 237,995

[22] Filed: May 4, 1994

[30] Foreign Application Priority Data

May 7, 1993 [JP] Japan .................. 5-131316

[51] Int. Cl.6 .................................... H01L 21/265
[52] U.S. Cl. ........................... 437/31; 437/27; 437/28; 437/47; 437/51; 437/89; 437/918; 148/DIG. 10; 148/DIG. 11; 148/DIG. 136; 257/379; 257/380
[58] Field of Search ............. 437/59, 918, 51, 47, 437/31, 89, 27, 28; 148/DIG. 136, DIG. 10, DIG. 11; 257/379, 380

[56] References Cited

U.S. PATENT DOCUMENTS

| | | | |
|---|---|---|---|
| 4,084,986 | 4/1978 | Aoki et al. | 437/918 |
| 4,467,519 | 8/1984 | Glang et al. | 437/60 |
| 4,762,801 | 8/1988 | Kapoov | 437/918 |
| 4,824,799 | 4/1989 | Komatsu | 437/89 |
| 5,024,957 | 6/1991 | Harane et al. | 437/31 |
| 5,110,757 | 5/1992 | Arst et al. | 437/89 |
| 5,139,959 | 8/1992 | Craft et al. | 437/918 |
| 5,252,143 | 10/1993 | Chiang et al. | 437/89 |
| 5,296,391 | 3/1994 | Sato et al. | 148/DIG. 10 |
| 5,356,830 | 10/1994 | Yoshikawa et al. | 437/89 |

FOREIGN PATENT DOCUMENTS

| | | |
|---|---|---|
| 57-128054 | 8/1982 | Japan . |
| 63-65664 | 3/1988 | Japan . |
| 64-42851 | 2/1989 | Japan . |

*Primary Examiner*—George Fourson
*Assistant Examiner*—Long Pham
*Attorney, Agent, or Firm*—Young & Thompson

[57] ABSTRACT

A collector region is formed in a semiconductor substrate. An insulating layer is formed on the semiconductor substrate, and a non-monocrystalline silicon layer is deposited thereon. The non-monocrystalline silicon layer is annealed to obtain a polycrystalline silicon layer which is patterned into a polycrystalline silicon resistor. The polycrystalline silicon resistor is covered by an insulating layer. Thereafter, a base region is formed, and an emitter region is formed in the base region.

30 Claims, 11 Drawing Sheets

METHOD FOR MANUFACTURING SEMICONDUCTOR DEVICE HAVING BIPOLAR TRANSISTOR AND POLYCRYSTALLINE SILICON RESISTOR

BACKGROUND OF THE INVENTION

1. Field of the Invitation

The present invention relates to a method for manufacturing a semiconductor device having a bipolar transistor and a polycrystalline silicon resistor on the same semiconductor substrate.

2. Description of the Related Art

In a semiconductor device having an active element such as a bipolar transistor and a passive element such as a resistor, in order to improve the performance of the device, i.e., in order to enhance the operation speed and the operation frequency, it is essential to reduce the parasitic capacitance of the resistor, in addition to the improvement of the performance of the bipolar transistor.

An impurity-doped polycrystalline silicon resistor which can be formed on a thick insulating layer has a smaller parasitic capacitance as compared with an impurity diffusion layer resistor.

In a prior art method for manufacturing an NPN-type bipolar transistor and a phosphorus-doped polycrystalline silicon resistor, an N+-type buried layer is formed within a P-type semiconductor substrate, and then, an N-type epitaxial layer collector region is formed thereon. Then, a P-type impurity diffusion layer base region is formed within the N-type epitaxial layer. After that, an insulating layer is formed on the entire surface. Then, a non-doped polycrystalline silicon layer is deposited by a chemical vapor deposition (CVD) process, and phosphorus ions are doped thereinto by an ion implantation process. The phosphorus-doped polycrystalline silicon layer is annealled and patterned, to thereby form a phosphorus-doped polycrystalline silicon resistor. Finally, an N-type impurity diffusion layer emitter region is formed within the P-type impurity diffusion layer (base region). This will be explained later in detail.

The reason why the phosphorus-doped polycrystalline silicon layer is annealled or heated is as follows:

i) If phosphorus ions are doped by an ion implantation method or the like into the polycrystalline silicon layer, the concentration distribution of phosphorus in the polycrystalline silicon along its perpendicular direction is not uniform. Therefore, if the phosphorus-doped polycrystalline silicon layer is etched without performing an annealling or heating process thereupon, the etched phosphorus-doped polycrystalline silicon layer is so overhung that other connections are shorted or disconnected. In order to avoid this, the phosphorus-doped polycrystalline silicon layer is annealled at a relatively low temperature, such as 800° C., before the etching operation thereof (see: JP-A-63-65664).

ii) If a silicon nitride layer formed by a plasma CVD process is formed on the polycrystalline silicon layer, unsaturated bonds of silicon included in the polycrystalline silicon layer are passivated by hydrogen included in the silicon nitride layer. As a result, the resistance of the polycrystalline silicon resistor fluctuates. In order to avoid this, an annealling operation at a relatively low temperature is carried out to diffuse hydrogen from the silicon nitride layer to the polycrystalline silicon layer, to saturate the unsaturated bonds of silicon thereof with hydrogen. Thus, the resistance of the polycrystalline silicon layer can be stabilized (see: JP-A-64-42851).

iii) If a silicon nitride layer is formed directly on the polycrystalline silicon layer, a large stress is applied to the silicon nitride layer. In order to avoid this, a light thermal oxidization is performed upon the polycrystalline silicon layer before the deposition of the silicon nitride layer, so that the stress upon the polycrystalline silicon layer can be relaxed by a thin silicon oxide layer therebetween (see: JP-A-57-128054).

In the above-mentioned prior art manufacturing method, however, since the annealling or heating operation performed upon the impurity-doped polycrystalline silicon layer is carried out after the formation of the base region, this annealling or heating operation is insufficient in view of the effect of the concentration distribution of impurities of the polycrystalline silicon layer. As a result, the resistance of the impurity-doped polycrystalline silicon resistor is not stable, since latter steps such as an emitter forming step and a plasma passivation layer forming step also affect the resistance of the impurity-doped polycrystalline silicon resistor.

On the other hand, in a bipolar high integrated circuit, in order to enhance the operation speed, the base region is made thinner. Therefore, even a low temperature annealling or heating operation performed upon the impurity-doped polycrystalline silicon layer affects the shape and concentration distribution of the base region, thus deteriorating the performance of the bipolar transistor.

SUMMARY OF THE INVENTION

It is an object of the present invention to perform a complete annealling or heating operation upon an impurity-doped polycrystalline silicon layer (resistor) in a semiconductor device having a bipolar transistor.

Another object of the present invention is to stabilize the shape and concentration distribution of a base region, to thereby make it thinner, thus improving the performance of the bipolar transistor.

According to the present invention, a collector region is formed in a semiconductor substrate. An insulating layer is formed on the semiconductor substrate, and a non-monocrystalline silicon (polycrystalline silicon or amorphous silicon) layer is deposited thereon. The non-monocrystalline silicon layer is annealled to obtain a polycrystalline silicon layer which is patterned into a polycrystalline silicon resistor. The polycrystalline silicon resistor is covered by an insulating layer. Thereafter, a base region is formed, and an emitter region is formed in the base region. As a result, the annealling (or heating) of the non-monocrystalline silicon layer never affects the base region.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIES

Before the description of the preferred embodiments, a prior art method for manufacturing a semiconductor device will be explained with reference to FIGS. 1A through 1F.

Figure 1A:
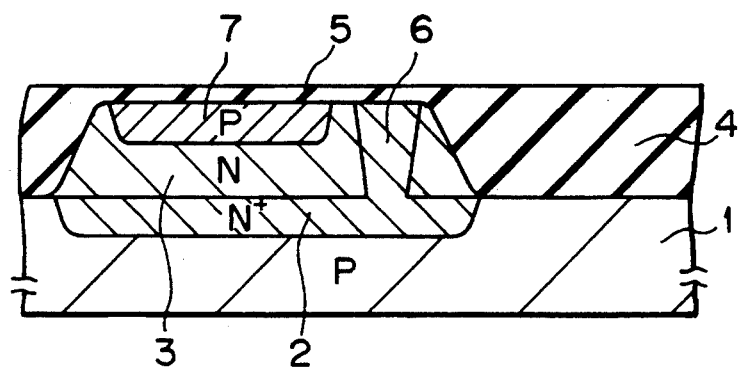
FIGS. 1A through 1F are cross-sectional views illustrating a prior art method for manufacturing a semiconductor device.

Referring to FIG. 1A, reference numeral 1 designates a P-type monocrystalline silicon substrate having a resistance $\rho s$ of about 10 to 20 $\Omega$·cm. Arsenic (As) ions are selectively implanted into the monocrystalline silicon substrate 1 to form an about 1.5 $\mu$m thick N+-type buried layer 2 having a concentration of $1 \times 10^{20}$ arsenic atoms/cm$^3$. Then, an about 0.8 $\mu$m thick N-type epitaxial layer having a concentration of about $1 \times 10^{16}$ phosphorus atoms/cm$^3$ is grown by a vapor phase epitaxial (VPE) method using a source gas of SiH$_4$ or SiH$_2$Cl$_2$ and a doping gas of PH$_3$ at a substrate temperature of about 1000° to 1100° C.

Next, an about 0.8 thick isolation silicon oxide layer 4 is formed by using a two-step selective oxidization process, i.e., a double local oxidation of silicon (LOCOS) process, to thereby partition active areas.

Next, an about 50 nm thick silicon oxide layer 5 is thermally grown on the active area.

Next, a collector pull-out region 6 having a concentration of about $1 \times 10^{20}$ phosphorus atoms/cm$^3$ is formed by using a photolithography and diffusion process.

Next, boron ions are implanted into the N-type epitaxial layer 3, to thereby form a P-type base region 7 having a depth of about 100 to 200 nm and a concentration of about $1 \times 10^{18}$ boron atoms/cm$^3$ within the N-type epitaxial layer 3.

Figure 1B:
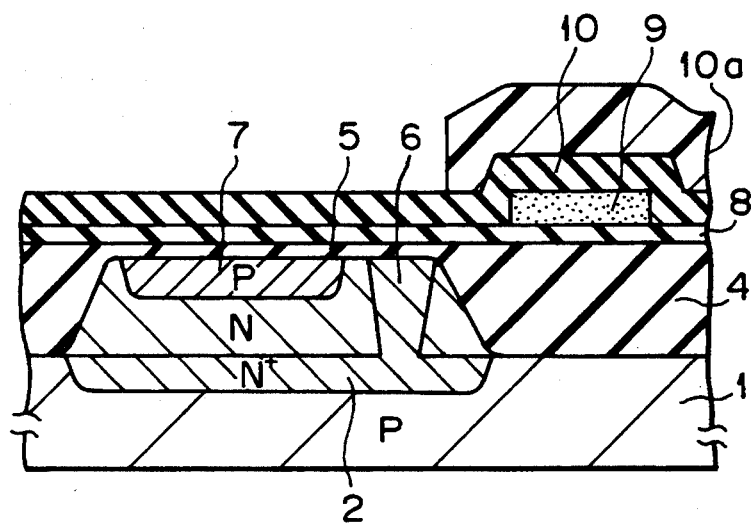

Next, referring to FIG. 1B, an about 100 nm thick silicon nitride layer 8 is deposited by a low-pressure chemical vapor deposition (CVD) process.

Next, an about 0.3 $\mu$m thick polycrystallene silicon layer 9 is deposited by a CVD process using a source gas of SiH$_2$Cl$_2$ at a substrate temperature of 650° C., and about $1 \times 10^{14}$ phosphorus ions/cm$^3$ are implanted thereinto at an energy of about 120 KeV. Then, the polycrystalline silicon layer 9 is annealled by using a rapid thermal annealling (RTA) process or a furnace annealling process at a temperature of about 1000° C. for about 10 seconds. Then, the polycrystalline silicon layer 9 is patterned by a photolithography process, so that the polycrystalline silicon layer 9 serves as a resistor.

Next, an about 50 to 500 nm thick cover silicon oxide layer 10 is deposited by a CVD process, and after that, a photoresist pattern 10a is formed on only the polycrystalline silicon layer 9.

Figure 1C:
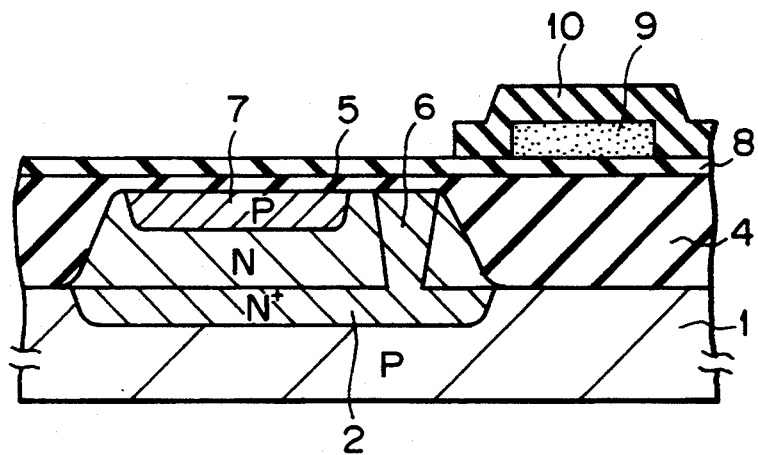

Next, the cover silicon oxide layer 10 is etched with a mask of the photoresist pattern 10a, and as a result, as illustrated in FIG. 1C, the cover silicon oxide layer 10 covers only the polycrystalline silicon layer 9. In this case, the silicon nitride layer 8 serves as an etching stopper.

Figure 1D:
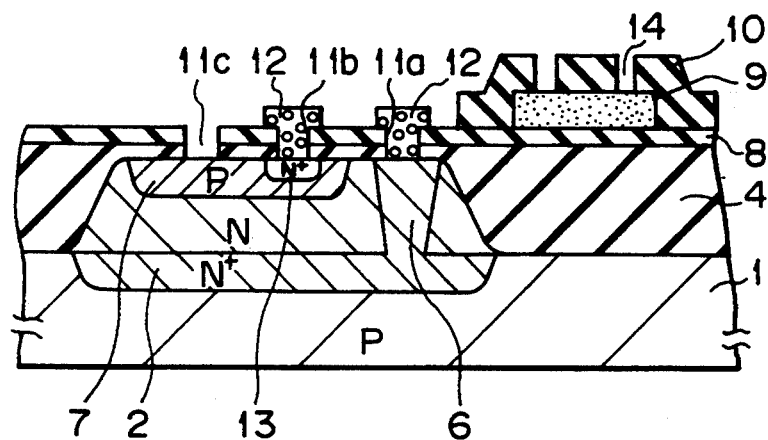

Next, referring to FIG. 1D, contact holes 11a, 11b and 11c are formed in the silicon nitride layer 8 and the silicon oxide layer 5 at predetermined areas of the collector pull-out region 6, an emitter region which will be formed later, and the base region 7, respectively. Then, a polycrystalline silicon layer 12 having a high concentration of arsenic atoms is deposited and is patterned so that the polycrystalline silicon 12 remains only at the contact holes 11a and 11b.

Next, a heating operation is carried out to diffuse the arsenic of the polycrystalline silicon layer 12 on the contact hole 11b into the base region 7, and as a result, an N+-type emitter region 13 is formed within the base region 7. Also, contact holes 14 are formed in the cover silicon oxide layer 10 for terminals connected to the polycrystalline silicon layer 9.

Figure 1E:
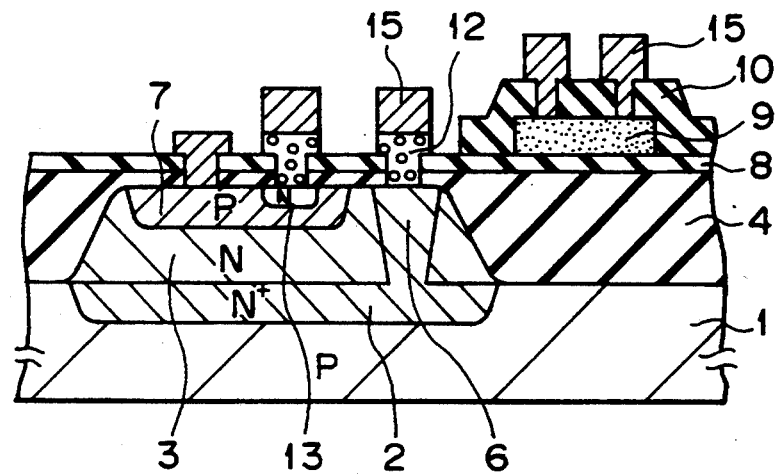

Next, referring to FIG. 1E, an aluminium (or its alloy) layer 15 is deposited by sputtering and patterned to form metal electrodes.

Figure 1F:
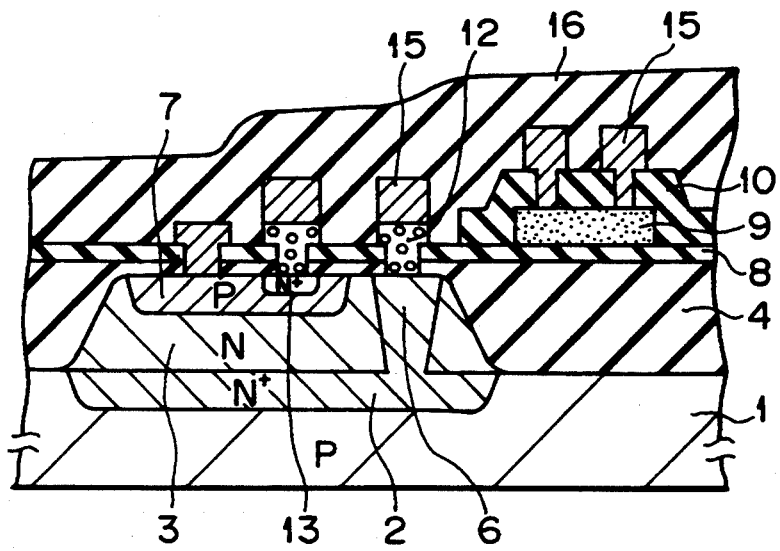

Next, referring to FIG. 1F, a silicon nitride layer 16 passivation layer is deposited by a plasma CVD process, to complete the semiconductor device.

In the manufacturing method as illustrated in FIGS. 1A through 1E, however, as stated above, since the annealling of the polycrystalline silicon layer 9 is carried out after the formation of the base region 7, the base region 7 is affected by this annealling process. Also, in order to reduce the adverse effect of the base region, the annealling of the polycrystalline silicon layer 9 per se is insufficient, so that the resistance of the polycrystalline silicon layer 9 is unstable.

FIGS. 2A through 2F are cross-sectional views illustrating a first embodiment of the semiconductor device according to the present invention.

Figure 2A:
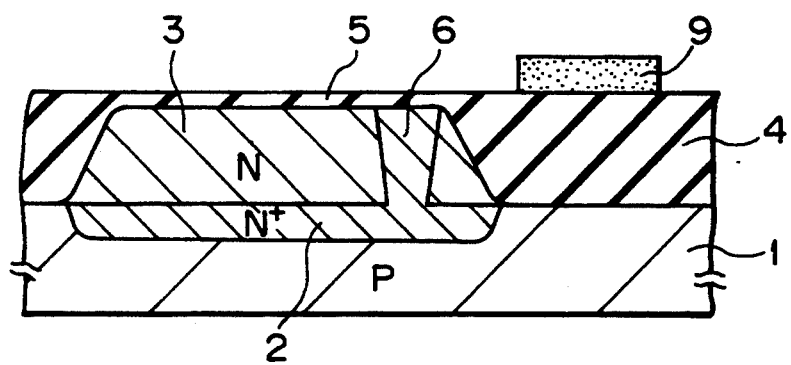
FIGS. 2A through 2F are cross-sectional views illustrating a first embodiment of the method for manufacturing a semiconductor device according to the present invention.

Referring to FIG. 2A, in the same way as in FIG. 1A, reference numeral 1 designates a P-type monocrystalline silicon substrate having a resistance $\rho s$ of about 10 to 20 $\Omega$·cm. Arsenic ions are selectively implanted into the monocrystalline silicon substrate 1 to form an about 1.5 $\mu$m thick N+-type buried layer 2 having a concentration of $1 \times 10^{20}$ arsenic atoms/cm$^3$. Then, an about 0.8 $\mu$m thick N-type epitaxial layer having a concentration of about $1 \times 10^{16}$ phosphorus atoms/cm$^3$ is grown by a VPE method using a source gas of SiH$_4$ or SiH$_2$Cl$_2$ and a doping gas of PH$_3$ at a substrate temperature of about 1000° to 1100° C.

Next, an about 0.8 thick isolation silicon oxide layer 4 is formed by using a double LOCOS process, to thereby partition active areas.

Next, an about 50 nm thick silicon oxide layer 5 is thermally grown on the active area.

Next, a collector pull-out region 6 having a concentration of about $1 \times 10^{20}$ phosphorus atoms/cm$^3$ is formed by using a photolithography and diffusion process.

Next, an about 0.3 $\mu$m thick polycrystalline silicon layer 9 is deposited by a CVD process using a source gas of SiH$_2$Cl$_2$ at a substrate temperature of about 630° C., and about $1 \times 10^{14}$ phosphorus ions/cm$^3$ are implanted thereinto at about 120 KeV. Then, the polycrystalline silicon layer 9 is annealled under a nitrogen gas atmosphere for an about one hour at a temperature of about 800° to 1100° C., preferably, a temperature of about 950° to 1000° C. As a result, the phosphorus ions of the polycrystalline silicon layer 9 are so active that the resistance thereof is stable. Thus, the resistance of the polycrystalline silicon layer 9 is hardly affected by the post-stage heating processes such as a heating process for forming a base region and a heating process for forming an emitter.

Thus, the polycrystalline silicon layer 9 is patterned by a photolithography process, so that the polycrystalline silicon layer 9 serves as a resistor. In this case, when a reactive ion etching (RIE) process using chlorine ($Cl_2$) gas is performed upon the polycrystalline silicon layer 9, little etching of the sides of the polycrystalline silicon layer occurs, thus avoiding the fluctuation of the resistance of the polycrystalline silicon layer 9.

Figure 2B:
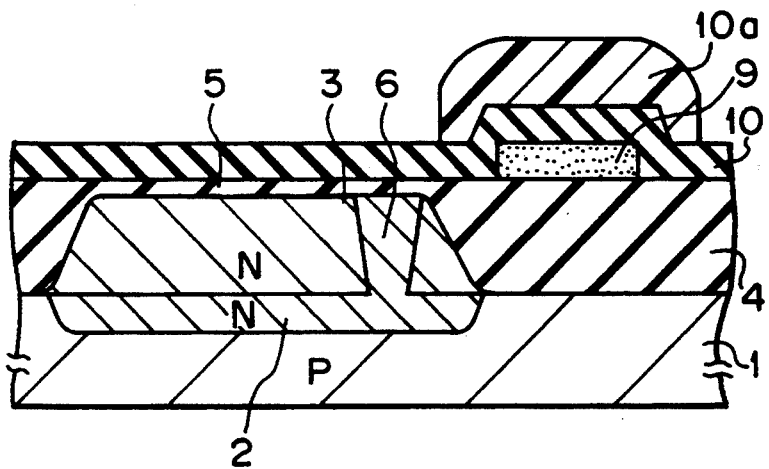

Next, referring to FIG. 2B, an about 50 to 500 nm thick cover silicon oxide layer 10 is deposited by a CVD process, and after that, a photoresist pattern 10a is formed on only the polycrystalline silicon layer 9.

Figure 2C:
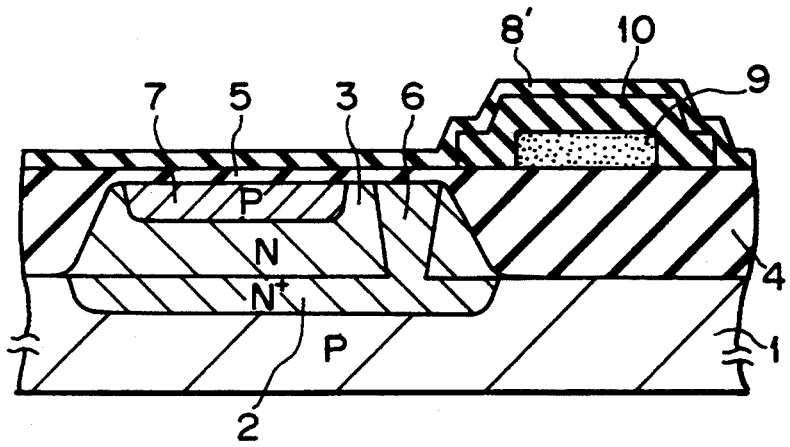

Next, the cover silicon oxide layer 10 is etched with a mask of the photoresist pattern 10a, and as a result, as illustrated in FIG. 2C, the cover silicon oxide layer 10 covers only the polycrystalline silicon layer 9.

Next, boron ions are implanted into the N-type epitaxial layer 3, to thereby form a P-type base region 7 having a depth of about 100 to 200 nm and a concentration of about $1 \times 10^{18}$ boron atoms/cm$^3$ within the N-type epitaxial layer 3.

Next, an about 100 nm thick silicon nitride layer 8' is deposited by a low-pressure CVD process. Note that the cover silicon oxide layer 10 smooths the stepped edges of the polycrystalline silicon layer 9, so that a stress of the silicon nitride layer 8' is relaxed. Also, the thickness of the cover silicon oxide layer 10 is preferably about 50 to 500 nm, since if this thickness is less than 50 nm, pin hole defects and coverage defects may be generated in the cover silicon oxide layer 10, and if this thickness is more than 500 nm, the evenness of the silicon nitride layer 8' is deteriorated.

Also, the silicon nitride layer 8' not only prevents the polycrystalline silicon layer 9 from being contaminated to thereby suppress the fluctuation of the polycrystalline silicon layer 9, but also passivates the base region 7 so that the value $h_{FE}$ is not deteriorated. Therefore, the silicon nitride layer 8' is made by using a low-pressure CVD process rather than a plasma CVD process to densify the silicon nitride layer 8'. Further, the thickness of the silicon nitride layer 8' is preferably from 50 to 200 nm, since if this thickness is less than 50 nm, the passivation effect is deteriorated, and if this thickness is more than 200 nm, the stress of the silicon nitride layer 8' is too large.

Figure 2D:
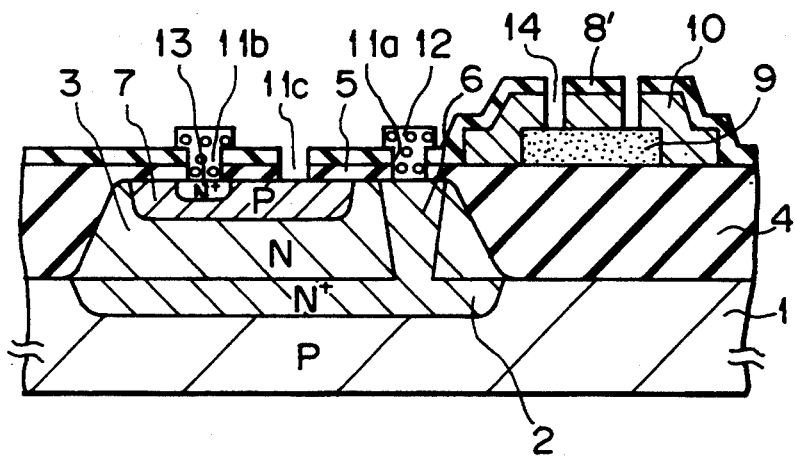

Next, referring to FIG. 2D, contact holes 11a, 11b and 11c are formed in the silicon nitride layer 8' and the silicon oxide layer 5 at predetermined areas of the collector pull-out region 6, an emitter region which will be formed later, and the base region 7, respectively. Then, a polycrystalline silicon layer 12 having a high concentration of arsenic atoms is deposited and is patterned so that the polycrystalline silicon 12 remains only at the contact holes 11a and 11b.

Next, a heating operation is carried out to diffuse the arsenic of the polycrystalline silicon layer 12 on the contact hole 11b into the base region 7, and as a result, an N+-type emitter region 13 is formed within the base region 7 or on the base region 7. Also, contact holes 14 are formed in the silicon nitride layer 8' and the cover silicon oxide layer 10 for terminals connected to the polycrystalline silicon layer 9.

Figure 2E:
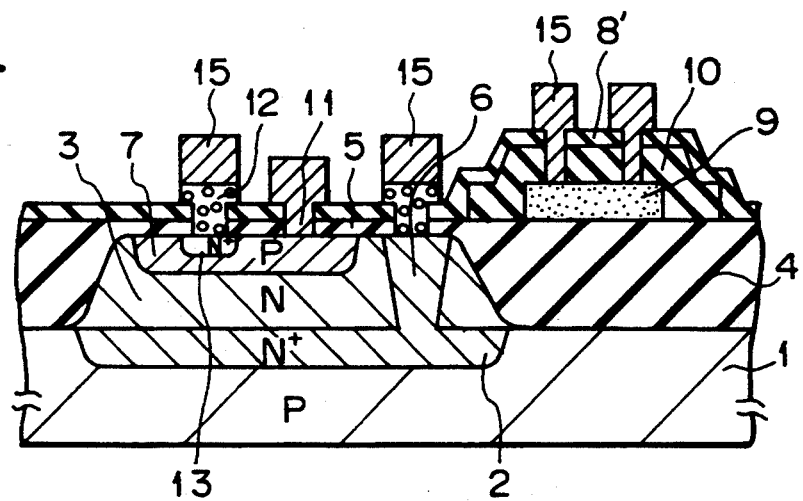

Next, referring to FIG. 2E, an aluminium (or its alloy) layer 15 is deposited by sputtering and patterned to form metal electrodes.

Figure 2F:
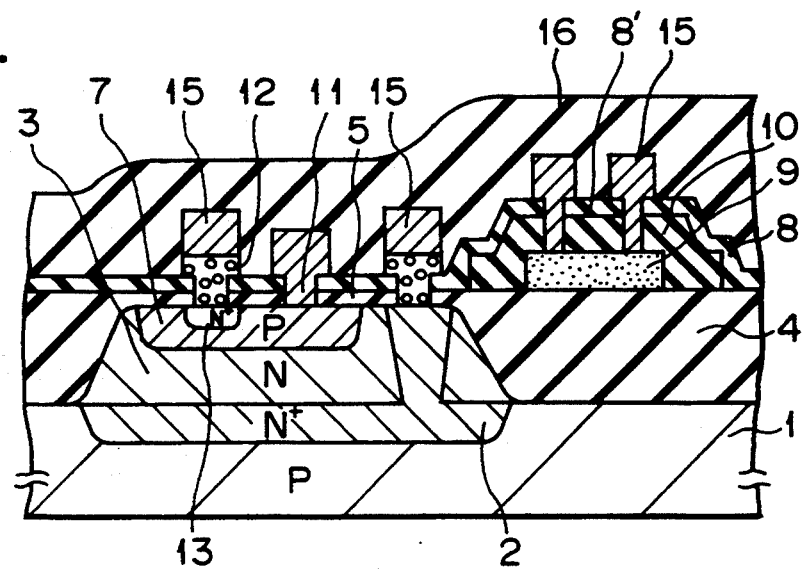
Figure 3:
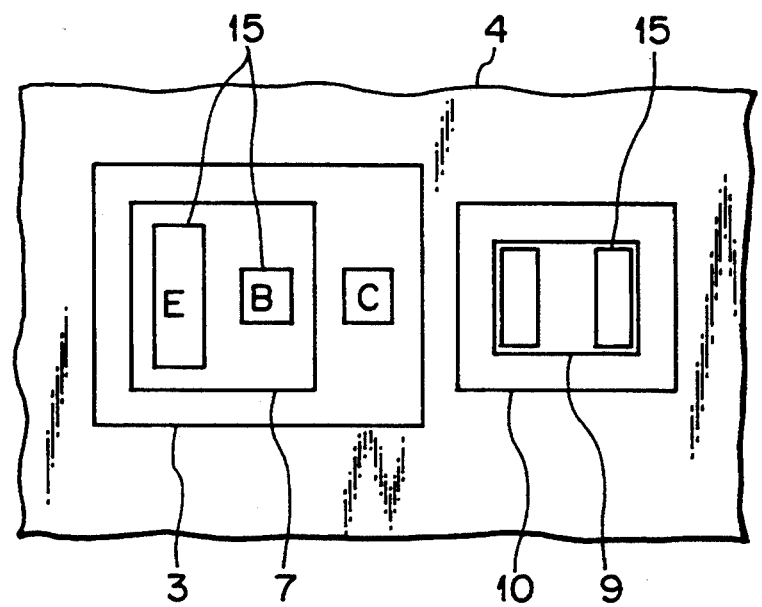
FIG. 3 is a plan view of the device of FIG. 2F.

Next, referring to FIG. 2F, a silicon nitride layer 16 passivation layer is deposited by a plasma CVD process, to complete the semiconductor device whose plan view is illustrated in FIG. 3.

Figure 4A:
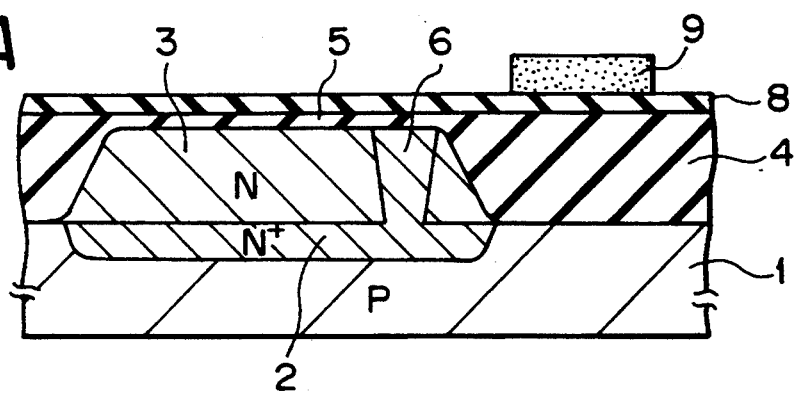
FIGS. 4A through 4F are cross-sectional views illustrating a second embodiment of the method for manufacturing a semiconductor device according to the present invention.
Figure 4B:
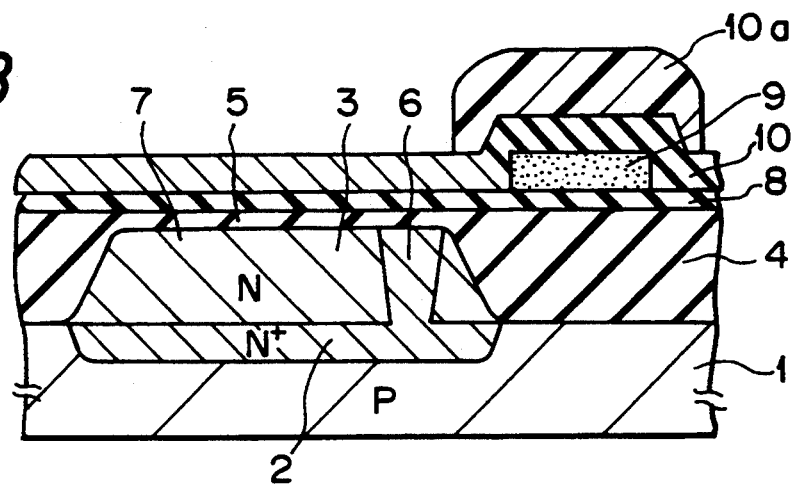
Figure 4C:
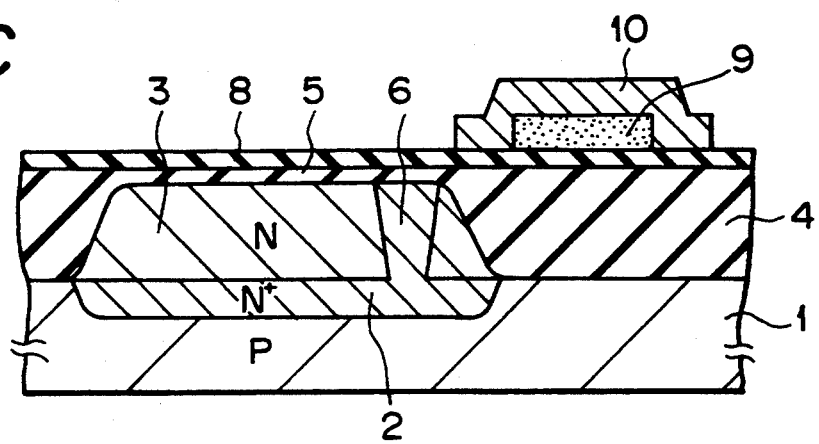
Figure 4D:
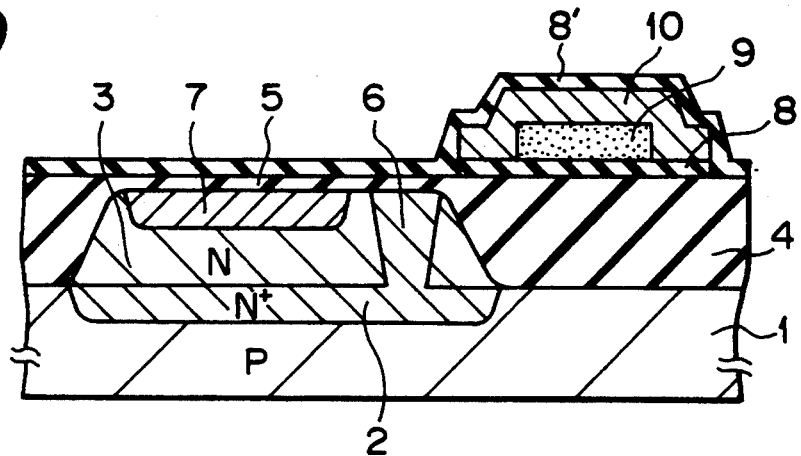
Figure 4E:
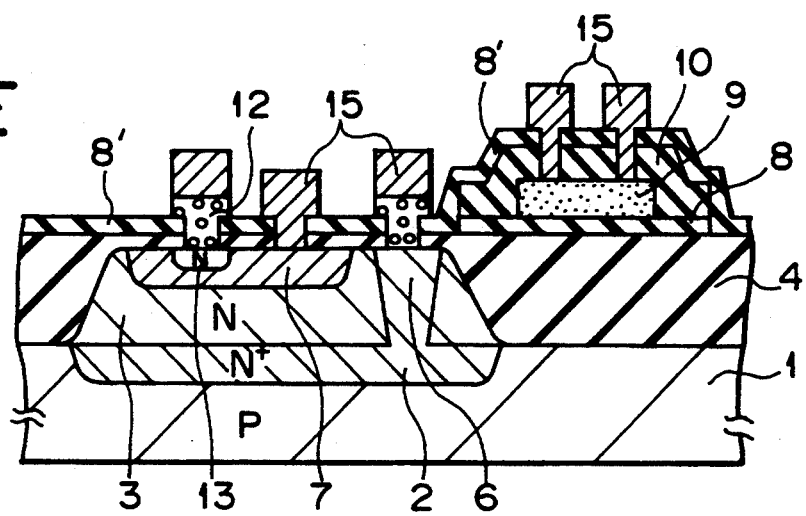
Figure 4F:
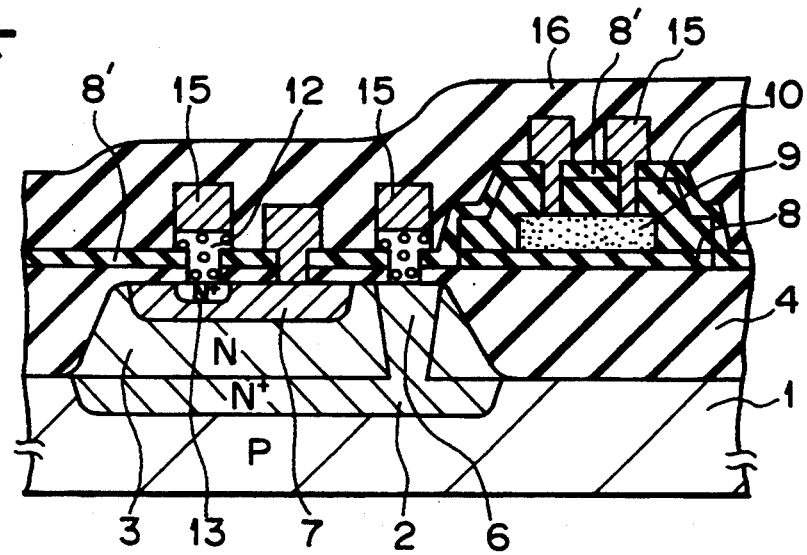

In FIGS. 4A through 4F, which are cross-sectional views illustrating a second embodiment of the semiconductor device, the silicon nitride layer 8 beneath the polycrystalline silicon layer 9 is added to the elements of the first embodiment as illustrated in FIGS. 2A through 2F. That is, as illustrated in FIG. 4B, when the cover silicon oxide layer 10 is etched with a mask of the photoresist pattern 10a, the silicon nitride layer 8 serves as an etching stopper. Therefore, the silicon oxide layers 4 and 5 are never etched during such an etching process for the cover silicon oxide layer 10, thus realizing a high manufacturing yield and an extremely reliable semiconductor device.

FIGS. 5A through 5F are cross-sectional views illustrating a third embodiment of the semiconductor device according to the present invention.

Figure 5A:
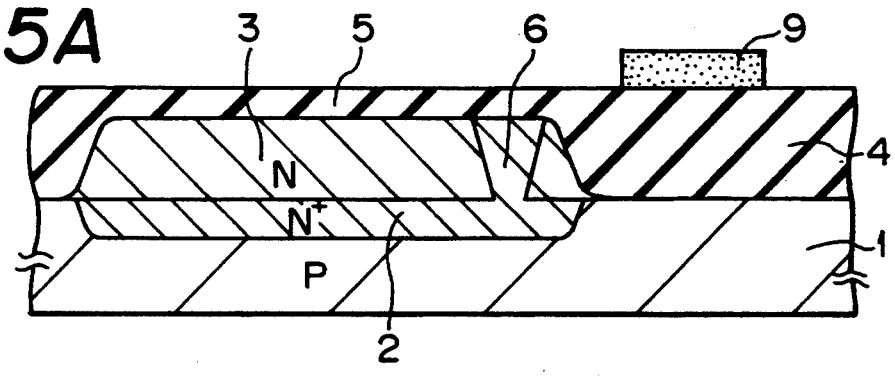
FIGS. 5A through 5F are cross-sectional views illustrating a third embodiment of the method for manufacturing a semiconductor device according to the present invention.

Referring to FIG. 5A, in the same way as in FIG. 2A, reference numeral 1 designates a P-type monocrystalline silicon substrate having a resistance $\rho s$ of about 10 to 20 Ω·cm. Arsenic ions are selectively implanted into the monocrystalline silicon substrate 1 to form an about 1.5 μm thick N+-type buried layer 2 having a concentration of $1 \times 10^{20}$ arsenic atoms/cm$^3$. Then, an about 0.7 μm thick N-type epitaxial layer having a concentration of about $1 \times 10^{16}$ phosphorus atoms/cm$^3$ is grown by a VPE method using a source gas of $SiH_4$ or $SiH_2Cl_2$ and a doping gas of $PH_3$ at a substrate temperature of about 1000° to 1100° C.

Next, an about 0.7 μm thick isolation silicon oxide layer 4 is formed by using a double LOCOS process, to thereby partition active areas.

Next, an about 70 nm thick silicon oxide layer 5 is thermally grown on the active area.

Next, a collector pull-out region 6 having a concentration of about $1 \times 10^{20}$ phosphorus atoms/cm$^3$ is formed by using a photolithography and diffusion process.

Next, an about 0.4 μm thick polycrystalline silicon layer 9 is deposited by a CVD process using a source gas of $SiH_4$ at a substrate temperature of about 650° C., and about $2 \times 10^{14}$ phosphorus ions/cm$^2$ are implanted thereinto at an energy of about 120 KeV. Then, the polycrystalline silicon layer 9 is annealed under a nitrogen gas atmosphere for an about one hour at a temperature of about 800° to 1100° C., preferably, a temperature of about 950° to 1000° C. As a result, the phosphorus ions of the polycrystalline silicon layer 9 is so active that the resistance thereof is stable. Thus, the resistance of the polycrystalline silicon layer 9 is hardly affected by the post-stage heating processes such as a heating process for forming a base region and a heating process for forming an emitter.

Then, the polycrystalline silicon layer 9 is patterned by a photolithography process, so that the polycrystalline silicon layer 9 serves as a resistor. In this case, when an RIE process using chlorine ($Cl_2$) gas is performed upon the polycrystalline silicon layer 9, little etching of the sides of the polycrystalline silicon layer 9 occurs, thus avoiding the fluctuation of the resistance of the polycrystalline silicon layer 9.

Figure 5B:
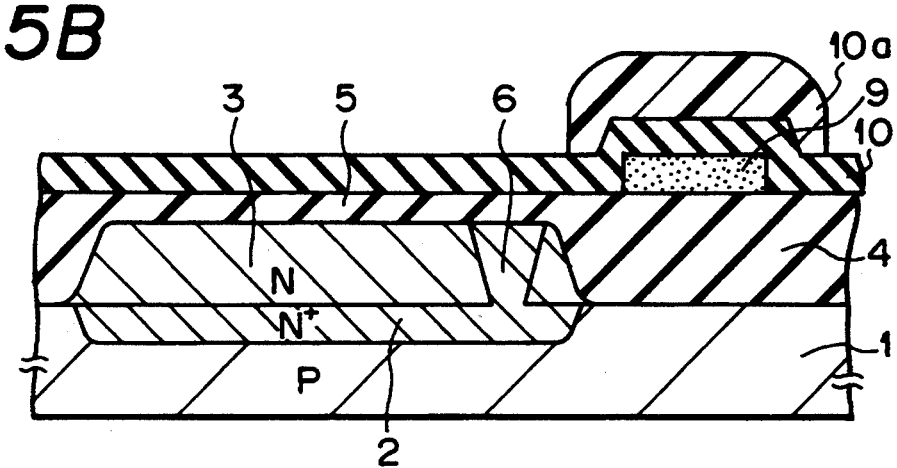

Next, referring to FIG. 5B, in the same way as in FIG. 2B, an about 50 to 500 nm thick cover silicon oxide layer 10 is deposited by a CVD process, and after that, a photoresist pattern 10a is formed on only the polycrystalline silicon layer 9.

Figure 5C:
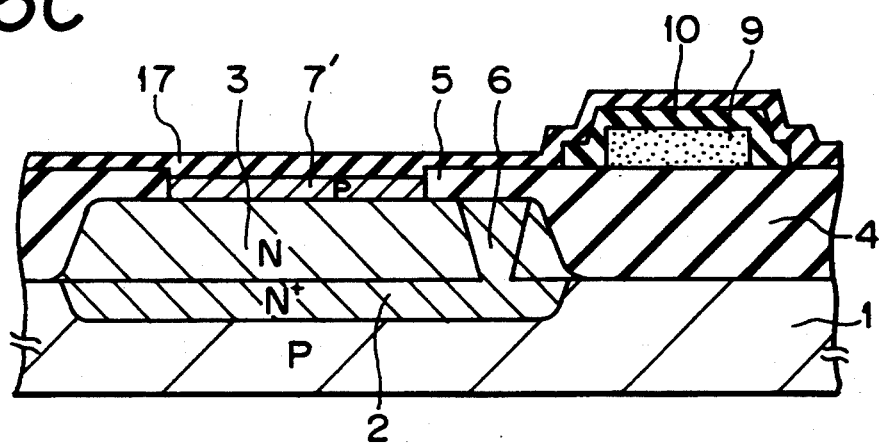

Next, the cover silicon oxide layer 10 is etched with a mask of the photoresist pattern 10a, and as a result, as illustrated in FIG. 5C, the cover silicon oxide layer 10 covers only the polycrystalline silicon layer 9.

Next, the silicon oxide layer 5 is etched by a photolithography process to form an opening in the silicon oxide layer 5. Then, an about 50 nm thick P-type epitaxial layer 7' having a concentration of about $1 \times 10^{19}$ boron atoms/cm$^3$ is grown in the opening by a molecular beam epitaxy process using an electron gun type silicon evaporating source and a dopant of $HBO_2$.

Note that a low pressure CVD process or an ultra high vacuum (UHV)-CVD process can be used instead of the molecular beam epitaxy process. For example, the conditions of a UHF-CVD process are as follows.
substrate temperature: 605° C.
pressure: $10^{-4}$ Torr
source gas: 12 sccm of $Si_2H_6$ and 0.03 sccm of $Cl_2$
dopant: $B_2H_6$ Next, an about 30 to 200 nm thick silicon oxide layer 17 is deposited by a thermal oxidation process or a CVD process. The thickness of the silicon oxide layer 17 is preferably about 100 nm.

Figure 5D:
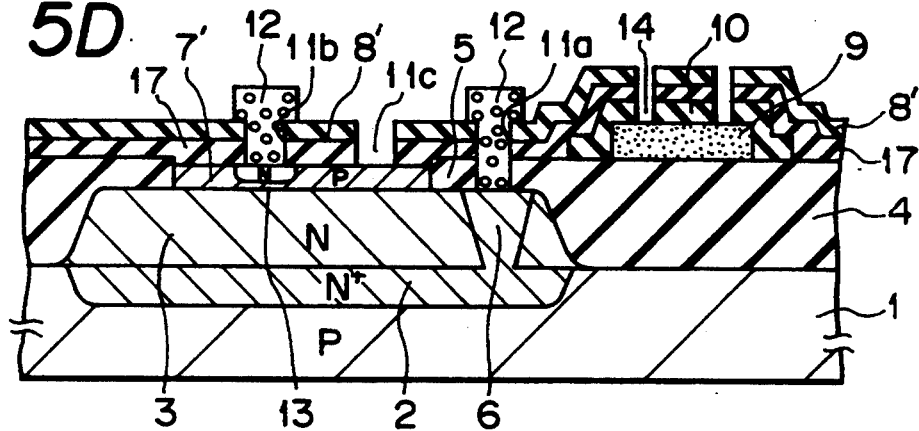

Next, referring to FIG. 5D, an about 100 nm thick silicon nitride layer 8' is deposited by a low-pressure CVD process. Note that the silicon oxide layer 17 relaxes the stress of the silicon nitride layer 8'.

Also, as explained above, the silicon nitride layer 8' not only prevents the polycrystalline silicon layer 7 from being contaminated to thereby suppress the fluctuation of the polycrystalline silicon layer 10, but also passivates the base region 7 so that the value h$_{FE}$ is not deteriorated. Therefore, the silicon nitride layer 8' is made by using a pressure CVD process rather than a plasma CVD process to densify the silicon nitride layer 8'.

Next, contact holes 11a, 11b and 11c are formed in the silicon nitride layer 8' and the silicon oxide layer 17 at predetermined areas of the collector pull-out region 6, an emitter region which will be formed later, and the base region 7, respectively. Then, a polycrystalline silicon layer 12 having a high concentration of arsenic atoms is deposited and is patterned so that the polycrystalline silicon 12 remains only at the contact holes 11a and 11b.

Next, a heating operation is carried out to diffuse the arsenic of the polycrystalline silicon layer 12 on the contact hole 11b into the base region 7, and as a result, an N+-type emitter region 13 is formed within the base region 7. Also, contact holes 14 are formed in the silicon nitride layer 8', the silicon oxide layer 17 and the cover silicon oxide layer 10 for terminals connected to the polycrystalliue silicon layer 9.

Figure 5E:
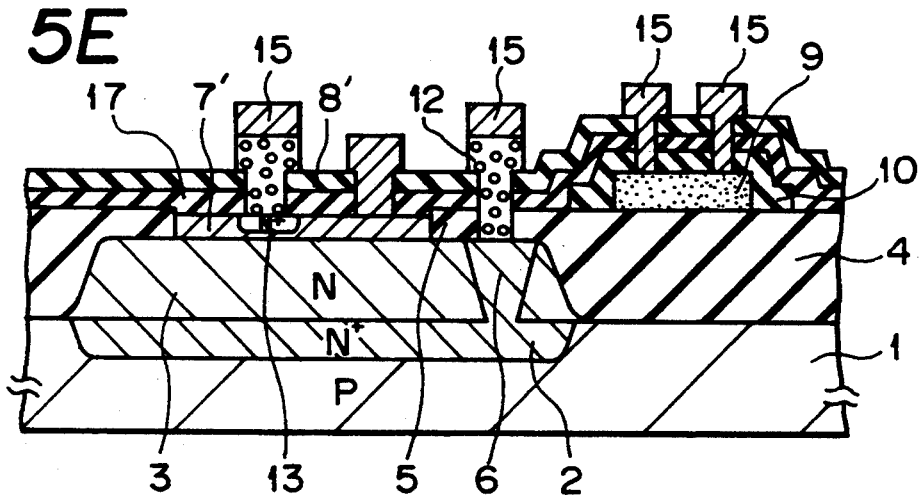

Next, referring to FIG. 5E, in the same way as in FIG. 2E, an aluminium (or its alloy) layer 15 is deposited by sputtering and patterned to form metal electrodes.

Figure 5F:
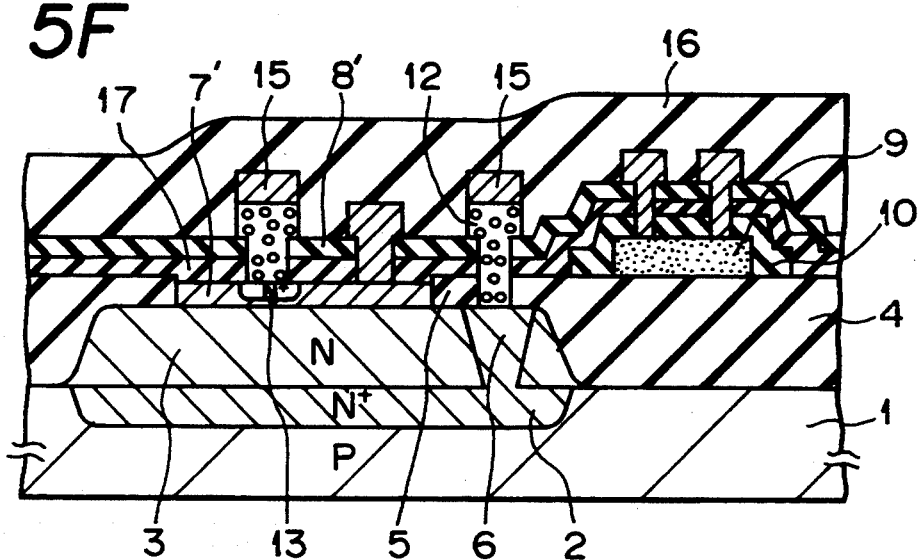

Next, referring to FIG. 5F, in the same way as in FIG. 2F, a silicon nitride layer 16 as a passivation layer is deposited by a plasma CVD process, to complete the semiconductor device.

Figure 6A:
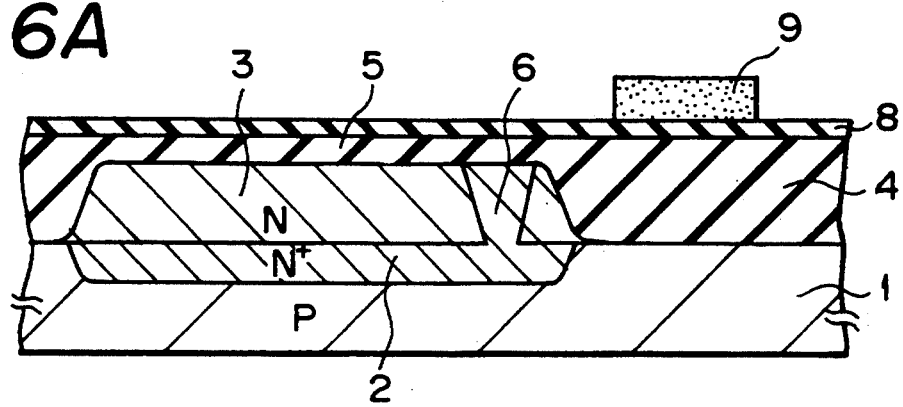
FIGS. 6A through 6F are cross-sectional views illustrating a fourth embodiment of the method for manufacturing a semiconductor device according to the present invention.
Figure 6B:
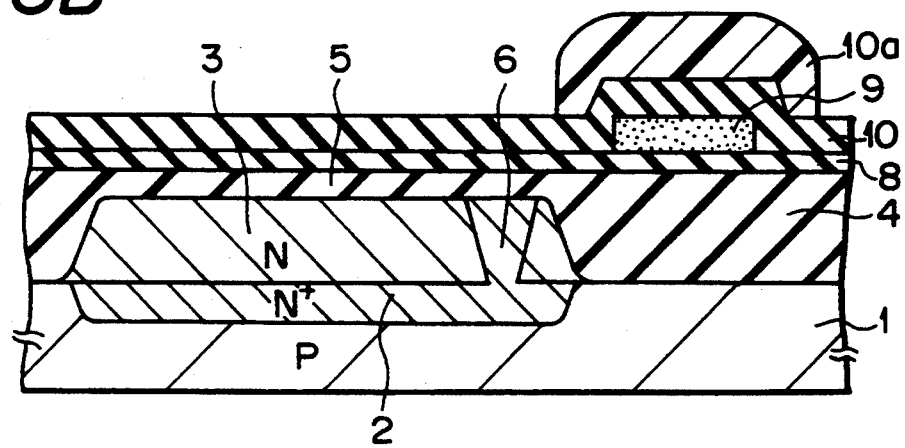
Figure 6C:
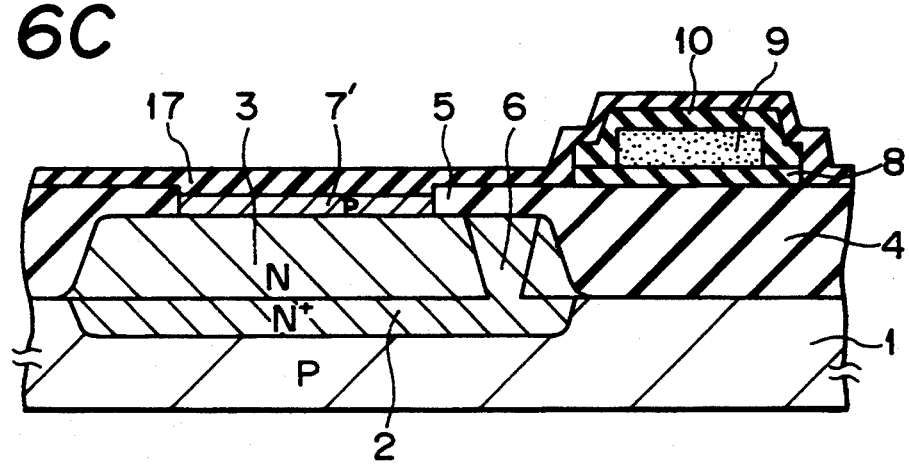
Figure 6D:
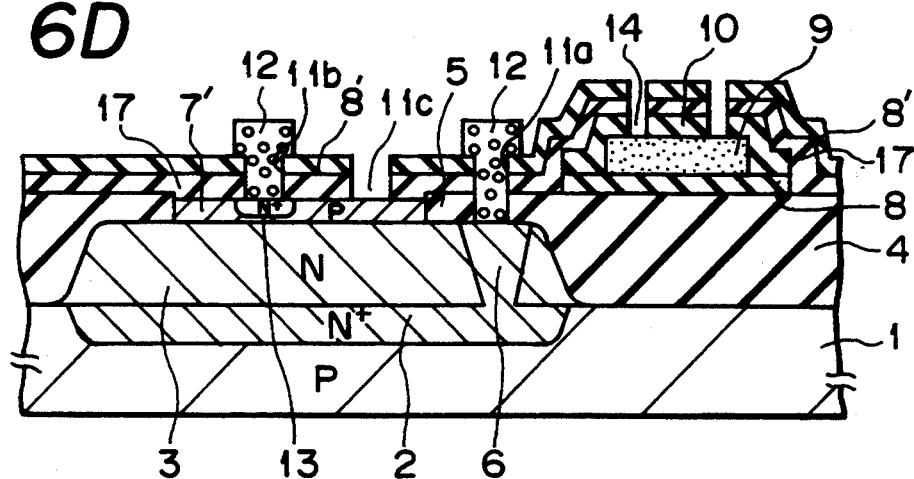
Figure 6E:
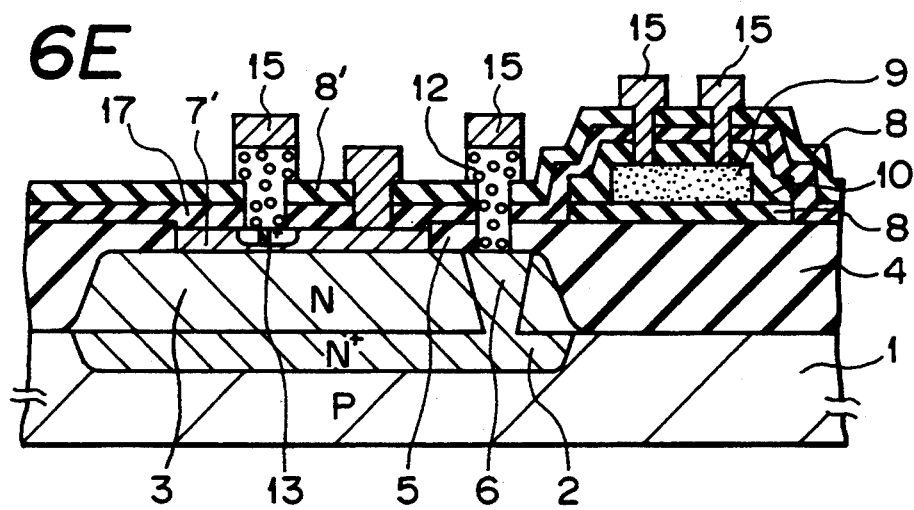
Figure 6F:
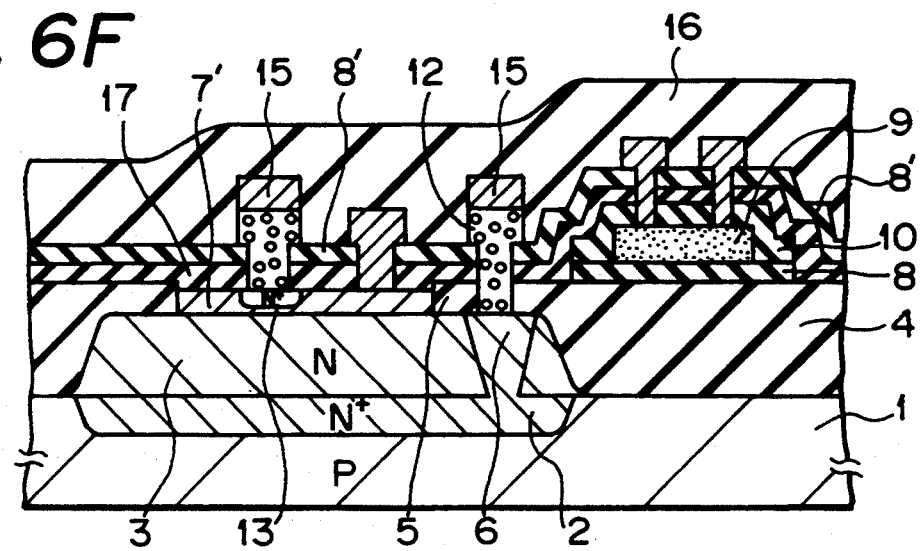

In FIGS. 6A through 6F, which are cross-sectional views illustrating a fourth embodiment of the semiconductor device, the silicon nitride layer 8 beneath the polycrystalline silicon layer 9 is added to the elements of the third embodiment as illustrated in FIGS. 5A through 5F. That is, as illustrated in FIG. 6B, when the cover silicon oxide layer 10 is etched with a mask of the photoresist pattern 10a, the silicon nitride layer 8 serves as an etching stopper. Therefore, the silicon oxide layers 4 and 5 are never etched during such an etching process for the cover silicon oxide layer 10, thus realizing a high manufacturing yield and an extremely reliable semiconductor device.

In the above-mentioned embodiments, although the polycrystalline silicon layer 9 is grown at a relatively high substrate temperature of about 650° C., amorphous silicon can be grown at a relative low substrate temperature of about 500° C. instead. In this case, after phosphorus ions are implanted into the amorphous silicon, an annealling operation at a temperature of about 500° to 600° C. is performed upon the amorphous silicon for about ten hours, to obtain a large-grain size polycrystalline silicon layer which is stable in the resistance value thereof. This is a so-called solid phase growth method. When this solid phase growth method is carried out immediately after the growth of amorphous silicon, the conditions of an annealling operation after the implantation of phosphorus ions are at a temperature of about 800° to 1100° C. for about 30 minutes to 1 hour.

Also, in the above-mentioned embodiments, it is possible to introduce P-type impurities into the polycrystalline silicon layer 9. Further, the introduction of impurities into the polycrystalline silicon layer 9 can be carried out during a CVD process or by a thermal diffusion process. Further, the emitter region 13 can be formed by using an epitaxial growth method. Still further, a triple layer made of Ti, Pt and Au can be used instead of the aluminium layer 15.

According to experiments carried out by the inventor, after the passivation layer 16 is formed, the fluctuation of the resistance of the polycrystalline silicon layer 9 is ±2% in the above-mentioned embodiments, while is ±10% in the prior art. Also, according to experiments carried out by the inventor, the fluctuation of the resistance of the polycrystalline silicon layer 9 in a final product is less than ±10% (3σ value), while is ±35% (3σ value) in the prior art.

As explained hereinbefore, according to the present invention, since the annealing (heating) of the polycrystalline silicon layer (resistor) can be at a sufficiently high temperature for a sufficiently long time, the resistance of the polycrystalline silicon layer (resistor) can be stable. Also, since the annealing (heating) of the polycrystalline silicon layer (resistor) hardly affects the base region of the bipolar transistor, the performance of the bipolar transistor can be improved. Particularly, since the base region can be made thinner, the operation speed of the bipolar transistor can be enhanced.

Modifications of the invention herein disclosed will occur to a person skilled in the art and all such modifications are deemed to be within the scope of this invention as defined by the appended claims.

I claim:

1. A method for manufacturing a semiconductor device comprising the steps of:

forming a collector region in a semiconductor substrate;

forming a first silicon oxide layer on said semiconductor substrate;
forming a first silicon nitride layer on said first silicon oxide layer;
forming a non-monocrystalline silicon layer including impurities on said first silicon nitride layer;
annealing said non-monocrystalline silicon layer convert it into a polycrystalline silicon layer;
patterning said polycrystalline silicon layer;
forming a second silicon oxide layer on said patterned polycrystalline silicon layer;
etching said second silicon oxide layer using said first silicon nitride layer as an etching stopper, so that said second silicon oxide layer covers only said patterned polycrystalline silicon layer:
etching said first silicon nitride layer using said second silicon oxide layer as a mask and said first silicon oxide layer as an etching stopper;
ion-implanting impurities into said collector region through said first silicon oxide layer so that a base region is formed within said collector region; and
forming an emitter region within said base region.

2. A method as set forth in claim 1, wherein said non-monocrystalline silicon layer is made of polycrystalline silicon.

3. A method as set forth in claim 2, wherein said annealling step comprises a step of carrying out an annealling operation at a temperature of about 800° to 1000° C. for about one hour.

4. A method as set forth in claim 1, wherein said non-monocrystalline silicon layer is made of amorphous silicon.

5. A method as set forth in claim 4, wherein said annealling step comprises a step of carrying out an annealling operation at a temperature of about 500° to 600° C. for about ten hours.

6. A method as set forth in claim 1, wherein said base region forming step comprises a step of implanting doping impurities into said collector region by a heating process.

7. A method as set forth in claim 1, further comprising a step of forming a second silicon nitride layer at least on said second silicon oxide layer.

8. A method as set forth in claim 7, wherein said second silicon nitride layer forming step includes a step of forming said second silicon nitride layer by a low-pressure CVD process.

9. A method for manufacturing a semiconductor device comprising steps of:
forming a collector region in a semiconductor substrate;
forming a first silicon oxide layer on said semiconductor substrate;
forming a first silicon nitride layer on said first silicon oxide layer;
forming a non-monocrystalline silicon layer including impurities on said first silicon nitride layer;
annealing said non-monocrystalline silicon layer to convert it into a polycrystalline silicon layer;
patterning said polycrystalline silicon layer; forming a second silicon oxide layer on said patterned polycrystalline silicon layer;
etching said second silicon oxide layer using said first silicon nitride layer as an etching stopper, so that said second silicon oxide layer covers only said patterned polycrystalline silicon layer:
etching said first silicon nitride layer using said second silicon oxide layer as a mask and said first silicon oxide layer as an etching stopper;
Implanting impurities into said collector region through said first silicon oxide layer so that a base region is formed within said collector region by diffusion; and
forming an emitter region within said base region.

10. A method as set forth in claim 9, wherein said non-monocrystalline silicon layer is made of polycrystalline silicon.

11. A method as set forth in claim 10, wherein said annealling step comprises a step of carrying out an annealling operation at a temperature of about 800° to 1000° C. for about one hour.

12. A method as set forth in claim 9, wherein said non-monocrystalline silicon layer is made of amorphous silicon.

13. A method as set forth in claim 12, wherein said annealling step comprises a step of carrying out an annealling operation at a temperature of about 500 to 600° C. for about ten hours.

14. A method as set forth in claim 9, further comprising a step of forming a second silicon nitride layer at least on said second silicon oxide layer.

15. A method as set forth in claim 14, wherein said second silicon nitride layer forming step includes a step of forming said second silicon nitride layer by a low pressure CVD process.

16. A method for manufacturing a semiconductor device comprising the steps of:
forming a collector region in a semiconductor substrate;
forming a first silicon oxide layer on said semiconductor substrate;
forming a non-monocrystalline silicon layer including impurities on said first silicon oxide layer;
annealling said non-monocrystalline silicon layer to convert it into a polycrystalline silicon layer;
patterning said polycrystalline silicon layer;
covering said patterned polycrystalline silicon layer with a second silicon oxide layer;
forming an opening in said first silicon oxide layer after said covering step is carried out, said opening reaching said collector region;
growing an epitaxial layer having impurities in said opening so that said epitaxial layer serves as a base region; and
forming an emitter region within said base region.

17. A method as set forth in claim 16, wherein said non-monocrystalline silicon layer is made of polycrystalline silicon.

18. A method as set forth in claim 17, wherein said annealling step comprises a step of carrying out an annealling operation at a temperature of about 800° to 1000° C. for about one hour.

19. A method as set forth in claim 16, wherein said non-monocrystalline silicon layer is made of amorphous silicon.

20. A method as set forth in claim 19, wherein said annealling step comprises a step of carrying out an annealling operation at a temperature of about 500° to 600° C. for about ten hours.

21. A method as set forth in claim 16, further comprising a step of forming a first silicon nitride layer on said first silicon oxide layer.

22. A method as set forth in claim 16, further comprising a step of forming a second silicon nitride layer at least on said second silicon oxide layer.

23. A method as set forth in claim 21, wherein said second silicon nitride layer forming step includes a step of forming said second silicon nitride layer by a low-pressure CVD process.

24. A method for manufacturing a semiconductor device comprising the steps of:

forming a collector region in a semiconductor substrate;

forming a first silicon oxide layer on said semiconductor substrate;

forming a first silicon nitride layer on said first silicon oxide layer;

forming a non-monocrystalline silicon layer including impurities on said first silicon nitride layer;

annealing said non-monocrystalline silicon layer to convert it into a polycrystalline silicon layer;

patterning said polycrystalline silicon layer;

forming a second silicon oxide layer on said patterned polycrystalline silicon layer;

etching said second silicon oxide layer using said first silicon nitride layer as an etching stopper, so that said second silicon oxide layer covers only said patterned polycrystalline silicon layer;

etching said first silicon nitride layer using said second silicon oxide layer as a mask and said first silicon oxide layer as an etching stopper;

forming an opening in said first silicon oxide layer, after said first silicon nitride layer etching step is carried out, said opening reaching said collector region;

growing an epitaxial layer having impurities in said opening so that said epitaxial layer serves as a base region; and forming an emitter region within said base region.

25. A method as set forth in claim 23, wherein said non-monocrystalline silicon layer is made of polycrystalline silicon.

26. A method as set forth in claim 24, wherein said annealing step comprises a step of carrying out an annealing operation at a temperature of about 800° to 1000° C. for about one hour.

27. A method as set forth in claim 23, wherein said non-monocrystalline silicon layer is made of amorphous silicon.

28. A method as set forth in, claim 26, wherein said annealing step comprises a step of carrying out an annealing operation at a temperature of about 500° to 600° C. for about ten hours.

29. A method as set forth in claim 23, further comprising a step of forming a second silicon nitride layer at least on said second silicon oxide layer.

30. A method as set forth in claim 28, wherein said second silicon nitride layer forming step includes a step of forming said second silicon nitride layer by a low-pressure CVD process.

* * * * *